United States Patent
Kubota et al.

(10) Patent No.: US 7,799,703 B2
(45) Date of Patent: Sep. 21, 2010

(54) PROCESSING METHOD AND STORAGE MEDIUM

(75) Inventors: Kazuhiro Kubota, Nirasaki (JP); Naotsugu Hoshi, Nirasaki (JP); Yuki Chiba, Albany, NY (US); Ryuichi Asako, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 253 days.

(21) Appl. No.: 12/025,359

(22) Filed: Feb. 4, 2008

(65) Prior Publication Data

US 2008/0194115 A1 Aug. 14, 2008

Related U.S. Application Data

(60) Provisional application No. 60/912,826, filed on Apr. 19, 2007.

(30) Foreign Application Priority Data

Feb. 14, 2007 (JP) .............................. 2007-033632

(51) Int. Cl.
*H01L 21/31* (2006.01)
*H01L 21/469* (2006.01)
*H01L 21/4763* (2006.01)

(52) U.S. Cl. ...................... 438/765; 438/768; 438/769; 438/794

(58) Field of Classification Search ................. 438/795, 438/725, 765, 768, 769, 794
See application file for complete search history.

(56) References Cited

U.S. PATENT DOCUMENTS

| 5,925,494 | A | * | 7/1999 | Horn | 430/270.1 |
| 2003/0119330 | A1 | * | 6/2003 | Tsai et al. | 438/717 |
| 2004/0142580 | A1 | * | 7/2004 | Toshima et al. | 438/795 |

FOREIGN PATENT DOCUMENTS

JP 2006-49798 2/2006

* cited by examiner

*Primary Examiner*—Thanh V Pham
*Assistant Examiner*—Maria Ligai
(74) *Attorney, Agent, or Firm*—Oblon, Spivak, McClelland, Maier & Neustadt, L.L.P.

(57) ABSTRACT

A processing method includes a gas having a Si—$CH_3$ bond supplied into a processing chamber after a target substrate to be processed is loaded into the processing chamber; and a silylation process performed on the target substrate. The internal pressure of the chamber by the supply of the gas having the Si—$CH_3$ bond and the gas supply time are set to be within ranges where the silylation process can be performed while the internal pressure of the chamber is decreased to reach an eligible pressure level where the wafer can be unloaded after the internal pressure of the chamber is increased up to a preset pressure by the supply of the gas.

5 Claims, 7 Drawing Sheets

PROCESSING METHOD AND STORAGE MEDIUM

FIELD OF THE INVENTION

The present invention relates to a processing method for performing a silylation process on a semiconductor device formed by using, for example, a single damascene or dual damascene method; and a storage medium storing therein a program used to execute the processing method.

BACKGROUND OF THE INVENTION

In a manufacturing process of a semiconductor device, a dual damascene method has been widely used to form wiring trenches or connection holes (see, for example, Japanese Patent Laid-open Application No. 2002-83869).

Meanwhile, with the miniaturization of the semiconductor device, a parasitic capacitance of an interlayer dielectric becomes an important factor for improving a wiring performance, and a low dielectric constant material (low-k material) is used to form the interlayer dielectric. As the low-k material for forming the interlayer dielectric, a material having an alkyl group such as a methyl group as an end group is generally utilized.

However, in the above-mentioned conventional damascene process, the interlayer dielectric made of the low-k material may be damaged during an etching process or a resist film removing process. Such damage causes an increase of a dielectric constant of the interlayer dielectric, thus diminishing or impairing the effect of using the low-k material.

To recover such damage, Japanese Patent Laid-open Application No. 2006-049798 discloses a method of performing a silylation process after performing the etching or resist film removing process. The silylation process reforms a surface of a damaged portion by using a silylizing agent so that an end group thereof becomes an alkyl group such as a methyl group.

In this silylation process, a pressure of a silylizing gas is set to be high and a processing time at that pressure is set to be long in order to allow a silylation reaction to progress sufficiently.

However, if the pressure of the silylizing gas is set high and the processing time at that pressure is set long, it takes time until the gas pressure reaches the target pressure, and a long period of time is consumed for the silylation process. As a result, a throughput deteriorates, and the amount of the silylizing gas consumed increases.

Moreover, if a processing temperature is set to be high so as to facilitate the silylation reaction, it takes time until the target temperature is obtained, whereby the throughput is further reduced. Besides, the high temperature accompanies a likelihood of Cu oxidation as well.

SUMMARY OF THE INVENTION

In view of the foregoing, the present invention provides a processing method capable of performing a silylation process with an enhanced throughput, while maintaining fine processing characteristics.

Further, the present invention also provides a computer readable storage medium for storing therein a control program to be used to execute the processing method.

The present inventors have found that when performing the silylation process, even if an internal pressure of a processing chamber by supply of the gas having a Si—$CH_3$ bond is set high and a maintenance time at a reached temperature is long, a recovery effect of the silylation process may not be improved as much as expected. It was proved that a desired effect can be obtained even with a lower pressure and a shorter processing time than those are in the conventional case as long as the internal pressure of the chamber by the supply of the gas having the Si—$CH_3$ bond and the gas supply time are set to be within ranges where the silylation process can be performed, while the internal pressure of the chamber is decreased to reach an eligible pressure level where the wafer can be unloaded after the internal pressure of the chamber is increased up to the target pressure by the supply of the gas.

In accordance with an aspect of the present invention, there is provided a processing method including: supplying a gas having a Si—$CH_3$ bond into a processing chamber after a target substrate to be processed is loaded into the processing chamber; and performing a silylation process on the target substrate. Herein the internal pressure of the chamber by the supply of the gas having the Si—$CH_3$ bond and the gas supply time are set to be within ranges where the silylation process can be performed, while the internal pressure of the chamber is decreased to reach an eligible pressure level where the wafer can be unloaded after the internal pressure of the chamber is increased up to the target pressure by the supply of the gas.

It is preferable that as soon as the chamber internal pressure reaches the preset pressure level by the supply of the gas having the Si—$CH_3$ bond, the internal pressure of the chamber is decreased.

Further, the gas having the Si—$CH_3$ bond is made up of at least one of TMSDMA (Dimethylaminotrimethylsilane), TMMAS (Trimethylmethylaminosilane), TMICS (Trimethyl (isocyanato)silane), TMSA (Trimethylsilylacetylene), and TMSC (Trimethylsilylcyanide).

Moreover, the preset pressure is about 1333 Pa (10 Torr), and the silylation process may be performed while the temperature of the target substrate is kept at about 100° C. or greater.

In accordance with an another aspect of the present invention, there is provided a computer readable storage medium for storing therein a computer executable control program for controlling a processing apparatus, such that the control program, when executed, controls the processing apparatus to perform the processing method described above.

In accordance with the present invention, it is possible to obtain a desired effect even with a lower pressure and a shorter processing time than those are in a conventional case as long as the internal pressure of the chamber by the supply of the gas having the Si—$CH_3$ bond and the gas supply time are set to be within ranges where the silylation process can be performed, while the internal pressure of the chamber is decreased to reach an eligible pressure level where the wafer can be unloaded after the internal pressure of the chamber is increased up to the target pressure by the supply of the gas. Therefore, both processing characteristics and throughput can be enhanced. Specifically, after the chamber internal pressure reaches the preset pressure by the supply of the gas having the Si—$CH_3$ bond, the internal pressure of the chamber is decreased without being maintained at the preset pressure. Accordingly, it is possible to maintain good processing characteristics by the short processing time.

BRIEF DESCRIPTION OF THE DRAWINGS

The above and other features of the present invention will become apparent from the following description of an embodiment given in conjunction with the accompanying drawings, in which.

DETAILED DESCRIPTION OF THE EMBODIMENT

Hereinafter, an embodiment of the present invention will be described in detail with reference to the accompanying drawings, which form a part hereof. The embodiment will be explained for an exemplary case of applying a processing method in accordance with the present invention to the manufacture of a semiconductor device using a single or dual damascene method.

Figure 1:
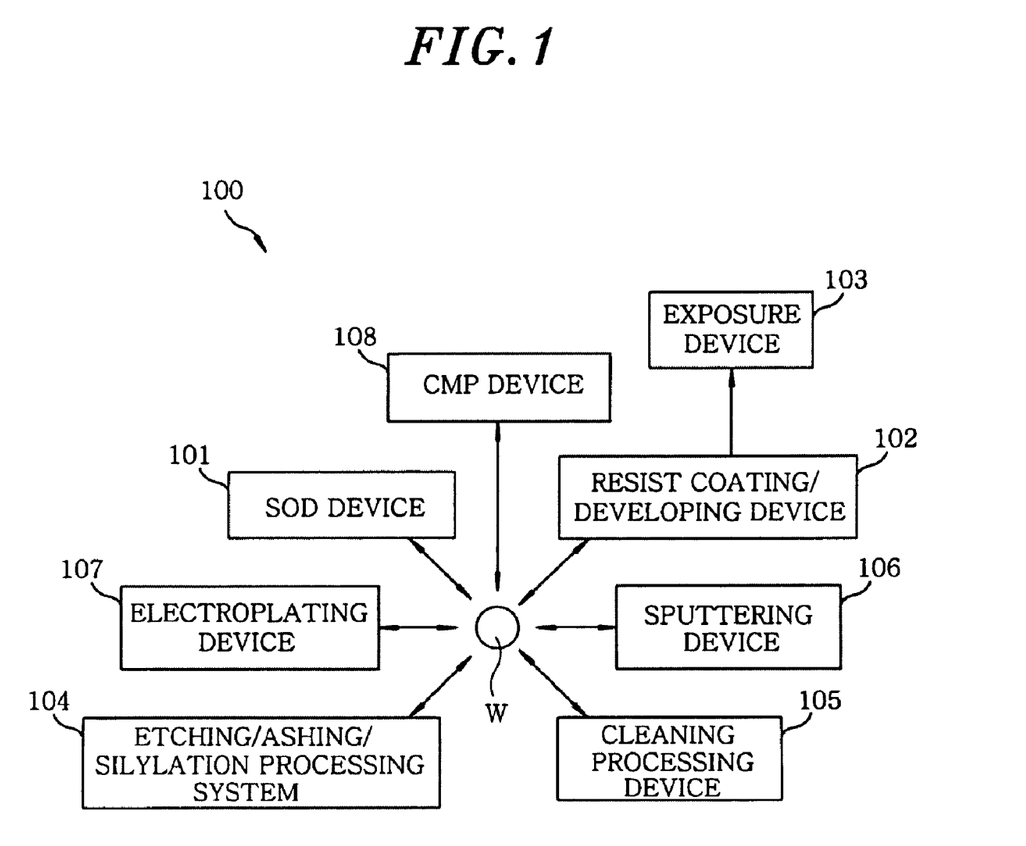
FIG. 1 is an explanatory diagram showing a schematic configuration of a semiconductor device manufacturing system using a silylation processing unit to which a processing method of the present invention is applied.

FIG. 1 is an explanatory diagram showing a schematic configuration of a semiconductor device manufacturing system 100 using a silylation processing unit which realizes the processing method of the present invention. The semiconductor device manufacturing system 100 includes an SOD (Spin On Dielectric) device 101; a resist coating/developing device 102; an exposure device 103; an etching/ashing/silylation processing system 104 for performing an etching process, a dry ashing process, and a silylation process; a cleaning processing device 105, a sputtering device 106 which is one of PVD (Physical Vapor Deposition) apparatuses; an electroplating device 107; and a CMP (Chemical Mechanical Polishing) device 108 used as a polishing apparatus. Here, the SOD device 101, the sputtering device 106 and the electroplating device 107 are film forming apparatuses. Further, for a transfer of a wafer W between the devices of the manufacturing system 100, a transfer method by an operator or a transfer method by a transfer mechanism (not shown) is employed.

The SOD device 101 is used to coat a liquid chemical on the wafer W and to form thereon an etching stopper film, a Si-containing low-k film to be used as an interlayer dielectric, and the like by a spin coating method. Though a detailed configuration of the SOD device 101 is not shown, the SOD device 101 includes a spin coater unit and a heat treating unit for heat-treating the wafer W having a coating film formed thereon. In a wafer processing system, a CVD (Chemical Vapor Deposition) apparatus forming an insulating film or the like on the wafer W by a CVD method may be used instead of the SOD device 101.

The resist coating/developing device 102 is used to form a resist film used as an etching mask, a bottom antireflection coating ("BARC"), and the like. Though a detailed configuration of the resist coating/developing device 102 is not shown, the resist coating/developing device 102 includes a resist coating unit for coating a resist solution on the wafer W and spin-coating thereon a resist film or the like; a BARC coating unit for forming a BARC on the wafer W; a sacrificial film coating unit for coating a sacrificial film on the wafer W; a developing unit for developing the resist film exposed to light in a specific pattern by the exposure device 103; a heat-treating unit for heat-treating the wafer W after each of the resist film forming process, the exposure process and the developing process; and so forth. The exposure device 103 is used to expose the wafer W formed of the resist film to light in a specific pattern.

The etching/ashing/silylation processing system 104 is used to perform a dry etching to form vias or trenches in an interlayer dielectric (low-k film), to perform a dry ashing to remove the resist film, and to perform a silylation process to recover a damage of the interlayer dielectric, as will be explained later. The etching, ashing and silylation processes are successively executed in a vacuum by a dry process.

The cleaning processing device 105 serves to clean the wafer W by using a processing solution, and it includes a cleaning unit to be described later, a heating unit for heating and drying the wafer W after cleaning it, and a transfer mechanism serving to transfer the wafer W between the cleaning unit and the heating unit.

The sputtering device 106 is used to form a diffusion barrier film, a Cu seed, and the like. The electroplating device 107 is used to fill wiring trenches having Cu seeds therein with Cu. Further, the CMP device 108 is used to planarize the surface of a Cu-embedded wiring or the like.

Figure 2:
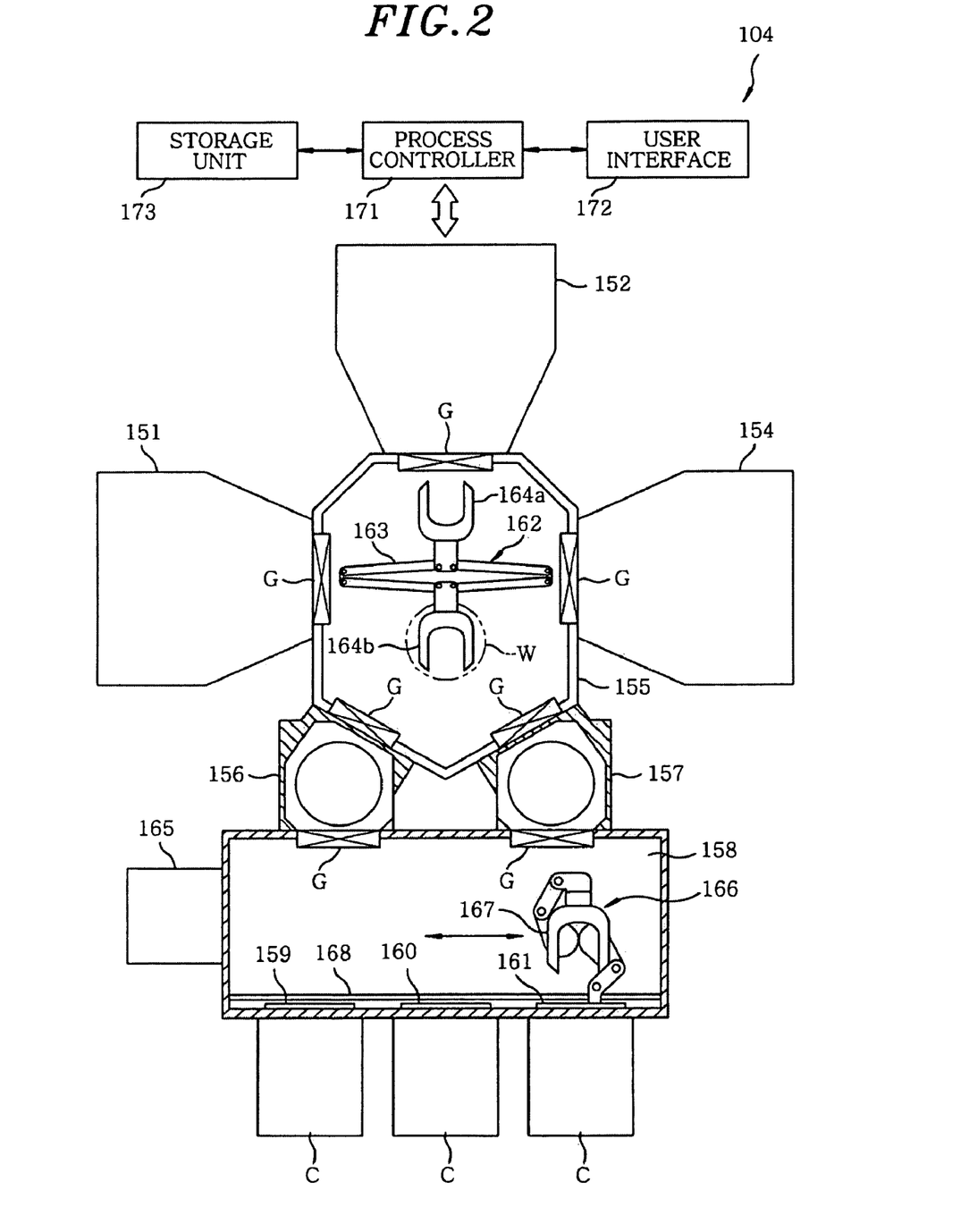
FIG. 2 sets forth a plan view showing a schematic configuration of an etching/ashing/silylation processing system for use in the semiconductor device manufacturing system of FIG. 1.

Below, the etching/ashing/silylation processing system 104 incorporating the silylation processing unit, which performs the processing method of the present invention, will be explained in detail. FIG. 2 is a plan view showing a schematic configuration of the etching/ashing/silylation processing system 104. The etching/ashing/silylation processing system 104 includes an etching unit 151 for performing a plasma etching, an ashing unit 152 for performing a plasma ashing and a silylation processing unit 153. These three processing units 151 to 153 are disposed to correspond to three sides of a polygonal wafer transfer chamber 155, respectively. Further, load lock chambers 156 and 157 are respectively disposed at two remaining sides of the wafer transfer chamber 155. A wafer loading/unloading chamber 158 is provided on the opposite side of the load lock chambers 156 and 157 to the wafer transfer chamber 155, and three ports 159 to 161 to which three carriers C capable of accommodating wafers W therein are attached are provided on the opposite side of the wafer loading/unloading chamber 158 to the load lock chambers 156 and 157.

The etching unit 151, the ashing unit 152, the silylation processing unit 153, and the load lock chambers 156 and 157 are connected to the respective sides of the wafer transfer chamber 155 via gate valves G, as shown in FIG. 2. By opening the gate valves G, they are allowed to communicate with the wafer transfer chamber 155, and by closing the gate valves G, they are isolated from the wafer transfer chamber 155. Furthermore, gate valves G are also provided at the portions of the load lock chambers 156 and 157 that make connection with the wafer loading/unloading chamber 158.

The load lock chambers 156 and 157 communicate with the wafer loading/unloading chamber 158 when the gate valves G are opened and are isolated from the wafer loading/unloading chamber 158 when the gate valves G are closed.

In the wafer transfer chamber 155, there is provided a wafer transfer mechanism 162 which performs loading and unloading of a wafer with respect to the etching unit 151, the ashing unit 152, the silylation processing unit 153, and the load lock chambers 156 and 157. The wafer transfer mechanism 162 is disposed substantially at the center of the wafer transfer chamber 155, and it includes a rotatable and extendible/retractable portion 163 that can make retracting, extending and rotating motions. At the tip ends of the rotatable and extendible/retractable portion 163, there are provided two blades 164a and 164b for holding the wafer W, wherein the two blades 164a and 164b are attached to the rotatable and extendible/retractable portion 163 such that they can be oriented in mutually opposite directions. Moreover, the interior of the wafer transfer chamber 155 is maintained at a specific vacuum level.

Each of the three ports 159 to 161 for holding the carriers C is provided with a shutter (not shown). When the carriers C, either accommodating wafers therein or remaining empty, are directly attached to the ports 159 to 162, and the shutters are then opened so that the carriers C are allowed to communicate with the wafer loading/unloading chamber 158 while preventing an infiltration of an exterior air. Furthermore, an alignment chamber 165 is provided at one side of the wafer loading/unloading chamber 158, and alignment of the wafer W is performed therein.

Disposed in the wafer loading/unloading chamber 158 is a wafer transfer mechanism 166 which performs loading and unloading of the wafer W with respect to the carriers C and the load lock chambers 156 and 157. The wafer transfer mechanism 166 has a multi-joint arm structure and is capable of moving along a rail 168 in an arrangement direction of the carriers C. The wafer transfer mechanism 166 is adapted to transfer the wafer by holding the wafer W with a hand 167 provided at a leading end thereof.

The etching/ashing/silylation processing system 104 includes a process controller 171 having a micro processor (computer). Each component of the etching/ashing/silylation processing system 104, i.e., the wafer transfer mechanisms 162 and 163 and each processing unit are connected to and controlled by the process controller 171. Further, connected to the process controller 171 is a user interface 172 which includes keyboard for an operator to manage each component of the etching/ashing/silylation processing system 104 by inputting a command; a display for visualizing and showing an operational status of each component of the etching/ashing/silylation processing system 104; and so forth. Further, also connected to the process controller 171 is a storage unit 173 which stores therein control programs to be used in realizing various processes performed by the etching/ashing/silylation processing system 104 under the control of the process controller 171; control programs, i.e., recipes, to be used in operating each component of the etching/ashing/silylation processing system 104 to carry out a desired process according to processing conditions; various databases; and so forth. The recipes are stored in a storage medium inside the storage unit 173. The storage medium may be a fixed device such as a hard disk or the like or may be a portable device such as a CDROM, a DVD, a flash memory, or the like. Alternatively, the recipes can be transmitted from another apparatus via, for example, a dedicated line.

When receiving a command from the user interface 172, the process controller 171 retrieves a necessary recipe from the storage unit 173 and executes it, whereby a desired process is performed in the etching/ashing/silylation processing system 104 under the control of the controller 171.

As the etching unit 151 and the ashing unit 152, various types of apparatuses typically employed in this field can be utilized. For example, it is preferable to use a parallel plate type apparatus which performs etching or ashing by a plasma of a processing gas which is generated by forming a high frequency electric field between a wafer mounting table and a shower head disposed to face the wafer mounting table, wherein the wafer mounting table serves as a lower electrode and a shower head serves as a upper electrode while supplying the processing gas.

Figure 3:
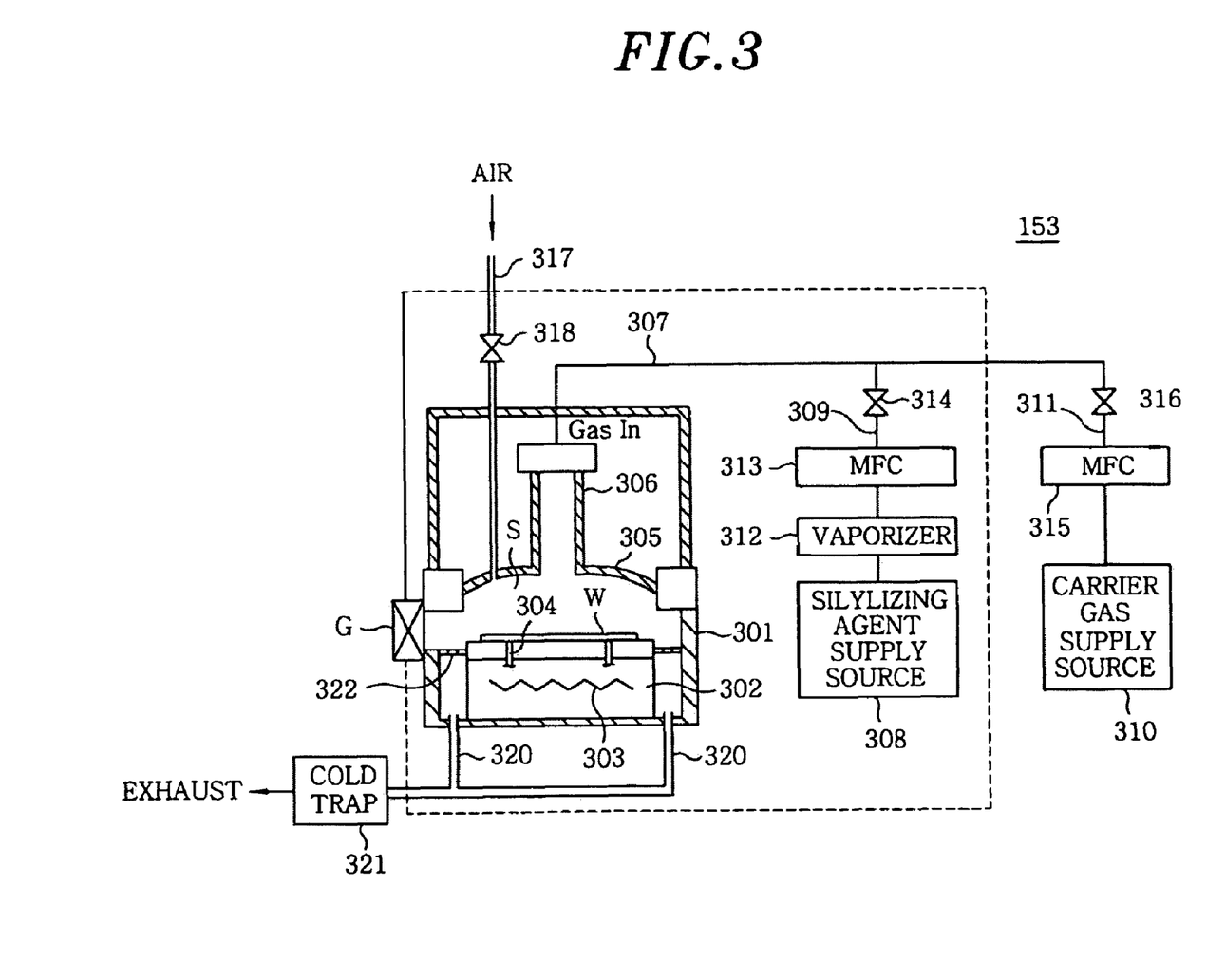
FIG. 3 presents a schematic cross sectional view showing a silylation processing unit mounted in the etching/ashing/silylation processing system.

Now, the silylation processing unit 153 will be explained in detail with reference to FIG. 3 which illustrates a schematic cross sectional configuration thereof. The silylation processing unit 153 includes a chamber 301 for accommodating a wafer W therein, and a wafer mounting table 302 is disposed in a lower portion of the chamber 301. The wafer mounting table 302 has a heater 303 embedded therein, so that the wafer W placed on the wafer mounting table 302 can be heated to a desired temperature. The wafer mounting table 302 is also provided with protrusible and retractable wafer lifting pins 304 so that the wafer W can be located at a position distanced upward from the wafer mounting table 302 when the loading and unloading of the wafer W is performed.

Inside the chamber 301, an internal vessel 305 is disposed to form a narrow processing space S containing the wafer W, and a silylizing agent (silylizing gas) is supplied into the processing space S. Formed at the center of the internal vessel 305 is a gas inlet path 306 which extends vertically.

A gas supply line 307 is connected to an upper portion of the gas inlet path 306, and coupled to the gas supply line 307 are a line 309 extended from a silylizing agent supply source 308 for supplying the silylizing agent (silylizing gas) and a line 311 extended from a carrier gas supply source 310 for supplying a carrier gas made up of Ar, $N_2$, or the like. A vaporizer 312 for vaporizing the silylizing agent, a mass flow controller 313 and an opening/closing valve 314 are installed in the line 309 in sequentially from the silylizing agent supply source 308.

Meanwhile, a mass flow controller 315 and an opening/closing valve 316 are installed in the line 311 sequentially from the carrier gas supply source 310. The silylizing agent vaporized by the vaporizer 312 is introduced into the processing space S enclosed by the internal vessel 305 via the gas supply line 307 and the gas inlet path 306 by being carried by the carrier gas. When a silylation process is performed, the wafer W is heated by the heater 303 up to a preset temperature. Here, the temperature of the wafer W can be controlled within a range from a room temperature to about 300° C. for example.

An air inlet line 317 communicating with the atmosphere is extended to the inside of the internal vessel 305 within the chamber 301. A valve 318 is installed on the air inlet line 317, and by opening the valve 318, air is introduced into the processing space S enclosed by the internal vessel 305 within the chamber 301, whereby moisture is supplied therein. Since the etching/ashing/silylation unit 104 performs etching, ashing and silylation processes successively in the vacuum atmosphere, there exists little moisture in the processing space W where the wafer W is located, and without moisture, it is difficult to progress a silylation reaction. Thus, prior to introducing the silylizing agent, it is preferable to introduce air into the processing space S and allow the wafer W to adsorb the moisture by opening the valve 318 of the air inlet line 317 in response to a command from the process controller 171 (see FIG. 2), thereby facilitating the silylation reaction.

In such case, in the aspect of supplying the moisture properly for the silylation reaction, it is preferable to introduce the silylizing agent after performing a moisture control through heating the wafer W on the wafer mounting table 302 by the heater 303 after the wafer W adsorbs the moisture, wherein the heating temperature is preferably about 50 to 200° C. Furthermore, in the aspect of facilitating the silylation reaction, it may be preferable to continue to heat the wafer W even after the supply of the silylizing agent is started.

A gate valve G is provided at a sidewall of the chamber 301, and while the gate valve G is open, the loading and unloading of the wafer W is carried out. Gas exhaust lines 320 are provided at the peripheral bottom portion of the chamber 301. The chamber 301 is evacuated by a vacuum pump (not shown) via the gas exhaust lines 320 so that the chamber 301 can be controlled to have an internal pressure lower than or equal to, for example, 10 Torr (1333 Pa). A cold trap 321 is provided on the gas exhaust line 321. Further, a baffle plate 322 is provided between an upper portion of the wafer mounting table 302 and a chamber sidewall.

Figure 4:
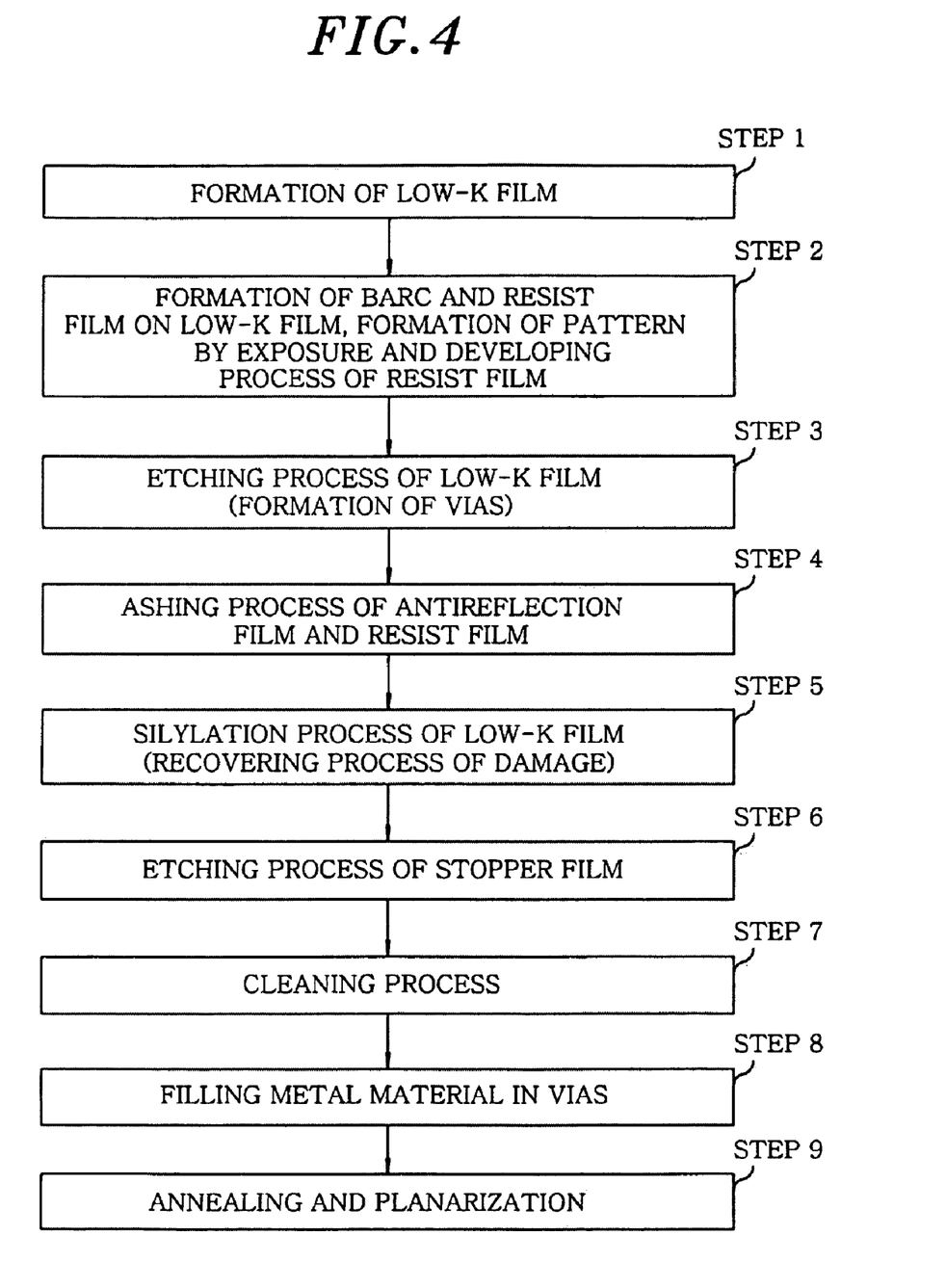
FIG. 4 depicts a flowchart to describe an exemplary semiconductor device manufacturing process performed by a single damascene method using the semiconductor device manufacturing system.

Hereinafter, a semiconductor device manufacturing process using a single damascene process, which is performed by the semiconductor device manufacturing system of FIG. 1, will be explained. FIG. 4 is a flowchart for describing the manufacturing process, and FIGS. 5A to 5G provide cross sectional views for describing the sequence of the process shown in FIG. 4.

Figure 5A:
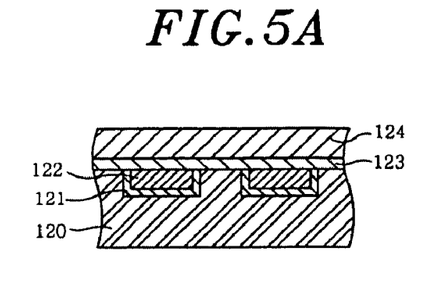
FIGS. 5A to 5G provide cross sectional views illustrating a process sequence of FIG. 4.

First, there is prepared a wafer which includes an insulating film 120 formed on a Si substrate (not shown); lower copper (Cu) wirings 122 formed in a top portion of the insulating film 120 via a barrier metal layer 121; and a stopper film (for example, an SiN film or an SiC film) 123 formed on the insulating film 120 and the lower Cu wirings 122. The wafer W is loaded into the SOD device 101, in which a low-k interlayer dielectric 124 is formed on the stopper film 123 (step 1), whereby a state shown in FIG. 5A is obtained.

Figure 5B:
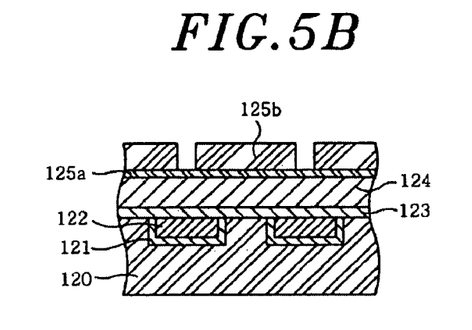

Then, the wafer W having the low-k film 124 formed thereon is loaded into the resist coating/developing device 102, in which a BARC 125a and a resist film 125b are sequentially formed on the low-k film 124. Subsequently, the wafer W is transferred into the exposure device 103 and is exposed to light in a specific pattern. Then, the wafer W is returned to the resist coating/developing device 102, in which the resist film 125b is developed by the developing processing unit, whereby the resist film 125b is provided with a specific pattern (step 2). As a result, a state shown in FIG. 5B is obtained.

Figure 5C:
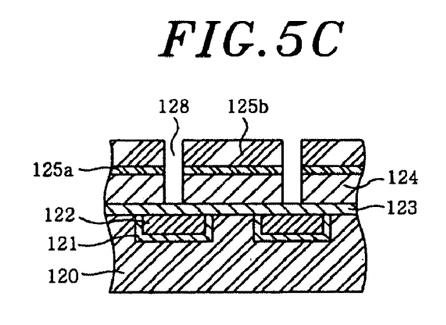

Subsequently, the wafer W is transferred into the etching/ashing/silylation processing system 104. In the system 104, the wafer W is first loaded into the etching unit 151, and a plasma etching of the low-k film 124 is performed (step 3), whereby vias 128 that reach the stopper film 123 are formed in the low-k film 124, as shown in FIG. 5C.

Figure 5D:
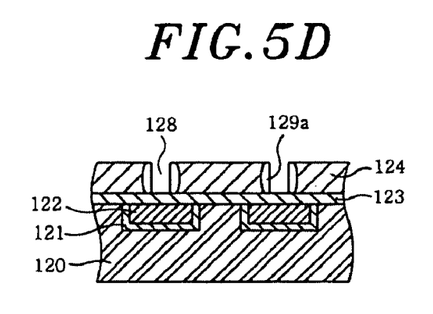

After the completion of the etching process, the wafer W is transferred into the ashing unit 152, in which the BARC 125a and the resist film 125b are removed by a plasma ashing process (step 4), as shown in FIG. 5D.

At sidewalls of the vias 128 present in the low-k film 124 after the BARC 125a and the resist film 125b are removed by the plasma ashing, a damaged portion 129 may be formed during the etching and the ashing processes, as shown in FIG. 5D. Further, though the damaged portion 129 is schematically shown in FIG. 5D, actually, a boundary between the damaged portion 129 and an undamaged portion is not clear as shown in the figure. If the vias 128 are filled with a metal material to form connection holes therein in the state the damaged portion 129 exists on the sidewalls of the vias 128, a parasitic capacitance between the wirings would be increased, resulting in problems such as a signal delay, a deterioration of insulation between the wirings, and so forth.

Figure 5E:
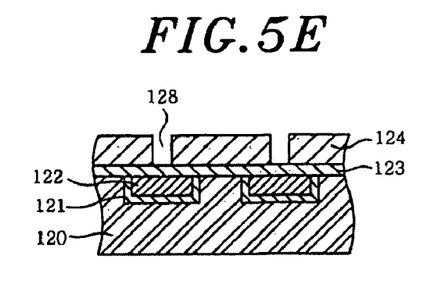

Thus, to recover the damage of the low-k film 124 after the resist film and the like is removed, the wafer W is transferred into the silylation processing unit 153, and a silylation process is performed on the wafer W (step 5), as shown in FIG. 5E. Through the silylation process, the recovery of the damage of the low-k film 124 is facilitated, so that the dielectric constant of the low-k film 124 can be recovered close to its initial value even after the plasma ashing involving damages is performed to remove the resist film 125b and the like.

The silylation process is performed in the silylation processing unit 153 as follows. First, the gate valve G is opened, and the wafer W is loaded into the chamber 301 and is mounted on the wafer mounting table 302. While heating the wafer W by the heater 303 up to a certain temperature, the chamber 301 is depressurized to a preset pressure level. Then, in this state, a silylizing agent vaporized by the vaporizer is supplied to the wafer W by being carried by a carrier gas, whereby the silylation process is executed.

Preferably, a gas having a Si—CH$_3$ bond is used as the silylizing agent (silylizing gas). Conventionally, as the silylizing gas, TMDS (1,1,3,3-Tetramethyldisilazane), TMSDMA (Dimethylaminotrimethylsilane), DMSDMA (Dimthylsilyldimethylamine), and the like have been utilized, and among them, TMSDMA having a high effect of recovering a dielectric constant (k value) has been most widely employed. Moreover, the present inventors have found that TMMAS (Timethylmethylaminosilane), TMICS (Trimethyl(isocyanato)silane), TMSA (Trimethylsilylacetylene), TMSC (Trimethylsilycyanide) have a k-value recovery effect equivalent to that of the TMSDMA. That is, the gas having the Si—CH$_3$ bond is preferably made up of at least one of TMSDMA, TMMAS, TMICS, TMSA and TMSC. Their chemical structures are as follows.

(Chemical formula 1)

A silylation reaction using TMSDMA can be expressed as follows.

(Chemical formula 2)

As for processing conditions for the silylation process in the silylation processing unit 153, the pressure of the silylizing gas was typically set to be high and a processing time at that pressure was set to be long in order to allow the silylizaing reaction to progress sufficiently. Further, a processing temperature was also set to be high so as to improve reactivity. For example, when TMSDMA was used as the silylizing agent, the wafer W was loaded into the silylation processing unit 153 and a TMSDMA gas was supplied into the chamber 301, and a high-pressure processing was performed for a long processing time wherein the internal pressure of the chamber 301 was increased up to 6665 Pa (50 Torr) and maintained thereat for 150 seconds. Thereafter, the internal pressure of the chamber 301 was reduced down to a pressure level where the unloading of the wafer W was possible. Further, a processing temperature was also set to a high level of about 150° C.

However, if the internal pressure of the chamber 301 by the supply of the silylizing gas is set to be high and the processing time at that pressure is set to be long, it takes time until the gas pressure reaches the target pressure, and a long period of time is consumed for the silylation process. As a result, a throughput deteriorates, and, the amount of the silylizing gas consumed increases. In addition, since the processing temperature is set to be high to facilitate the silylation reaction, it takes time until the temperature rises to the set temperature level, which also results in a reduction of the throughput. Besides, the high temperature accompanies a likelihood of Cu oxidation as well.

Meanwhile, when performing the silylation process, even if the internal pressure of the chamber 301 by the supply of the gas having the Si—$CH_3$ bond is set high and the maintenance time at the reached temperature is long, the recovery effect of the silylation process may not be improved as much as expected. It was proved that a desired effect can be obtained even with a lower pressure and a shorter processing time than those are in the conventional case as long as the internal pressure of the chamber 301 by the supply of the gas having the Si—$CH_3$ bond and the gas supply time are set to be within ranges where the silylation process can be performed, while the internal pressure of the chamber is decreased to reach an eligible pressure level where the wafer W can be unloaded after the internal pressure of the chamber is increased up to the target pressure by the supply of the gas.

Specifically, it was proved that the same recovery effect as obtained by the conventional process sequence can be attained with a process sequence of: increasing the internal pressure of the chamber 301 up to 1333 Pa (10 Torr) by introducing the silylizing agent into the chamber 301; and reducing the internal pressure as soon as it reaches the target pressure of 1333 Pa without maintaining the reached pressure level.

Figure 6:
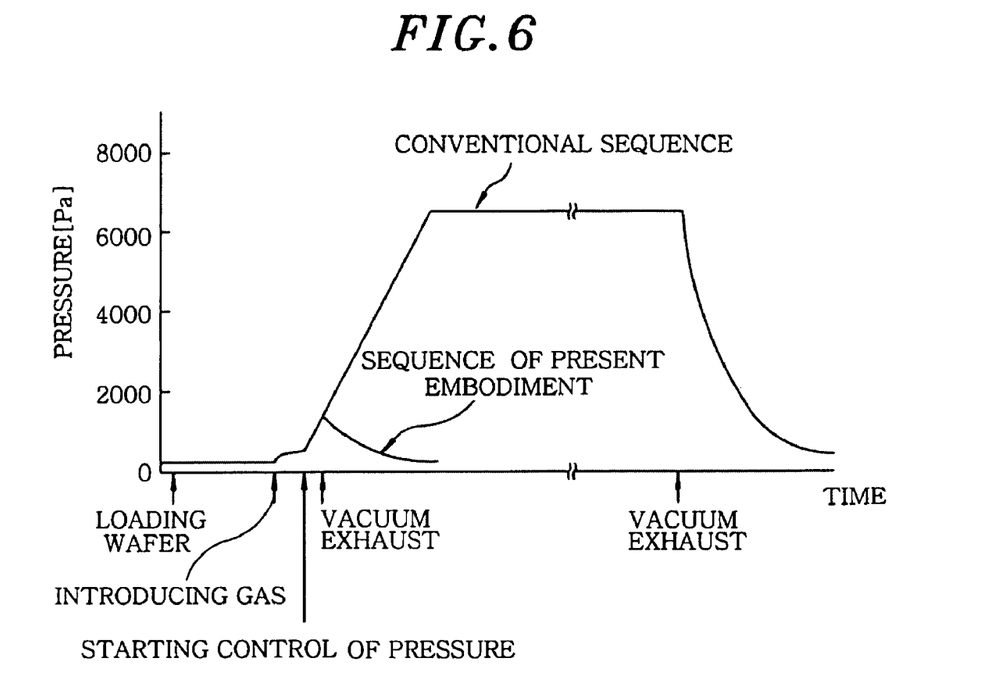
FIG. 6 is a diagram providing a comparison of a process sequence of a conventional silylation process and a process sequence of a silylation process in accordance with an embodiment of the present invention.

FIG. 6 describes such process sequence in accordance with the present embodiment, in comparison with the conventional process sequence. As shown in FIG. 6, by employing the process sequence in accordance with the present embodiment, the silylation process can be completed in a shorter period of time, and a throughput can be considerably enhanced, compared to the conventional case.

If an integration of pressure with respect to time reaches a certain value in a pressure range greater than a pressure level where the silylation process can take place, a desired recovery characteristic can be obtained by the silylation process. It is conjectured that such recovery effect does not improve greatly even if the integration of pressure with respect to the time exceeds the certain valve. Further, it was proved that the certain value is much smaller than that under the conventional conditions.

Further, even when the temperature is reduced from 150° C. to 100° C. after executing the above-described process sequence, the same recovery effect can be obtained, so it is possible to reduce the processing temperature less than conventional cases. Thus, a reduction of throughput and a problem of Cu oxidation can be avoided.

Figure 5F:
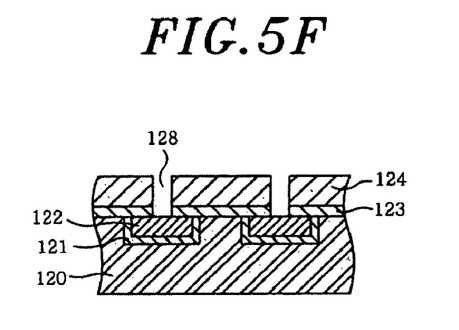
Figure 5G:
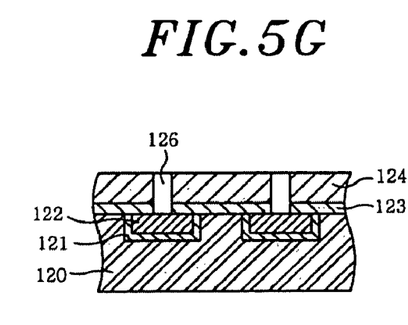

After the silylation process of the wafer W is completed, etching of the stopper film 123 is performed (step 6, see FIG. 5F). This etching process may be performed in a different apparatus from the present system or may be performed in the etching unit 151.

Subsequently, the wafer W is transferred into the cleaning processing device 105 and is cleaned therein (step 7). The low-k film 124 may be damaged due to the etching in step 6 or the cleaning process in step 7. In such case, the same silylation process as described above can be performed.

Thereafter, the wafer W is transferred to the sputtering device 106, in which a barrier metal film and a Cu seed layer is formed on the inner wall of the vias 128. Then, the wafer W is transferred into the electroplating device 107, in which the vias 128 is filled with copper 126 used as a wiring metal by electroplating (step 8, see FIG. 5G). Afterward, annealing of the copper 126 buried in the vias 128 is performed by heat-treating the wafer W (no annealing device is shown in FIG. 1), and the wafer W is transferred to the CMP device 108, where a planarization process is performed by a CMP method (step 9), and a desired semiconductor device is finally obtained.

Now, there will be explained a comparison result of a recovery effect of two cases of performing a silyation process under the conditions in accordance with the present embodiment and performing a silyation process under conventional conditions after performing etching and ashing processes.

Figure 7:
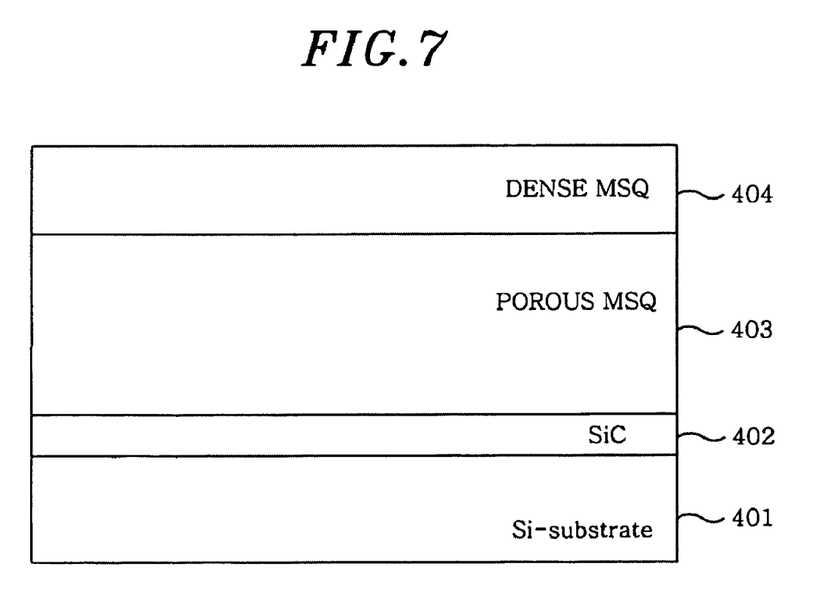
FIG. 7 shows a wafer structure used in an experiment.
Figure 8:
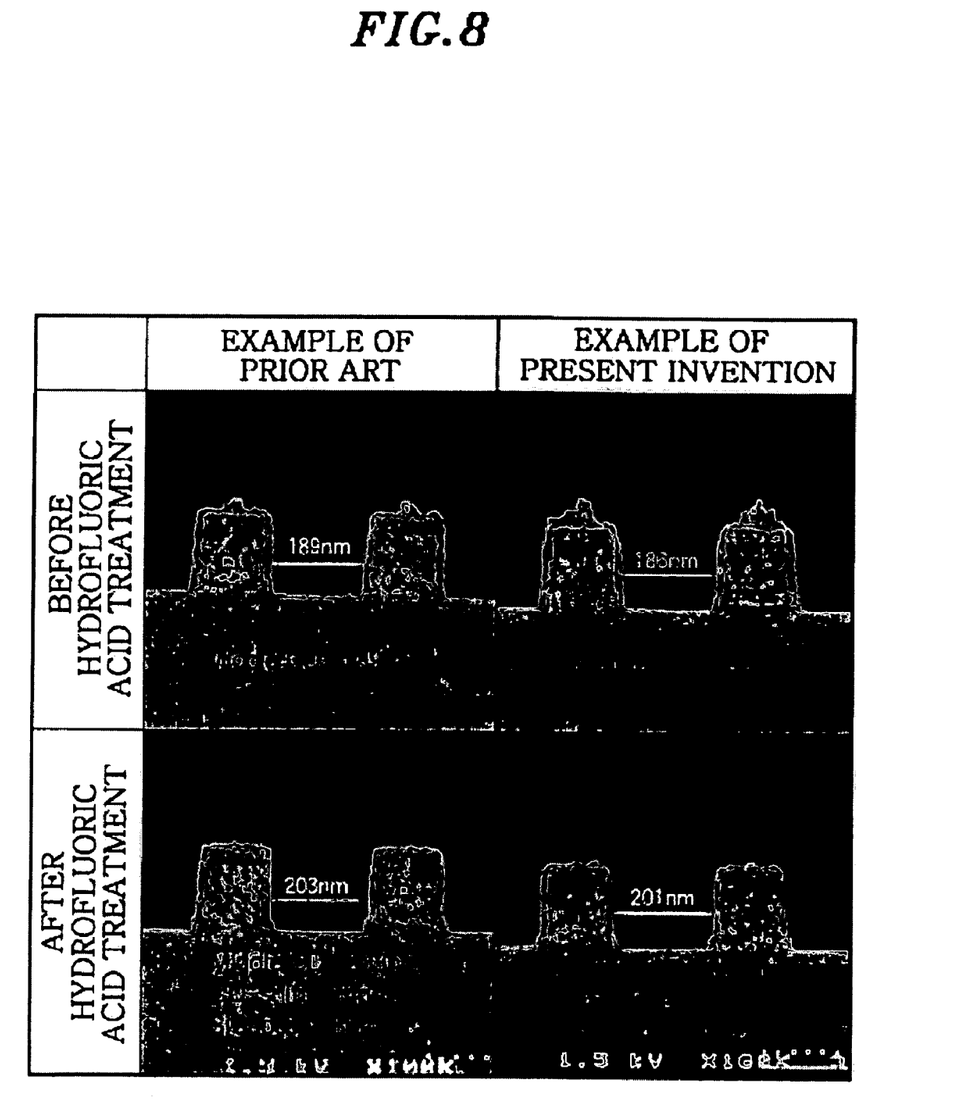
FIG. 8 illustrates pattern states before and after a hydrofluoric acid treatment in separate cases of performing a silylation process under conventional conditions and under conditions in accordance with the embodiment of the present invention.

Here, a wafer having, on a Si substrate 401, a SiC etching stopper film 402, a porous MSQ (methyl-hydrogen-Silses-Quioxane) film 403 and a dense MSQ film 404 as shown in FIG. 7, was prepared. First, etching was performed by the etching unit while using a resist film as a mask, and the etching unit was opened to the atmosphere, and the wafer was unloaded from the etching unit and is diced. Then, the dices were attached to the center of bare wafers, and ashing was performed thereon. Then, without opening to the atmosphere, a silylation process was performed.

Dielectric constants (k values) were measured before starting the processing, after performing the etching and ashing, and after performing the silylation processes under the conventional conditions and under the conditions in accordance with the present embodiment. Further, leakage currents were also measured for each case. The results are shown in Table 1. Table 1 shows a k value at a room temperature, a k value at 200° C., a difference Δk between the two, a k-value recovery ratio by the silylation process, a leakage current value, and a recovery ratio of the leakage current by the silylation process. As can be seen from Table 1, the same recovery effect as obtained by the silylation process performed under the conventional conditions could be achieved by the silylation process performed under the conditions in accordance with the embodiment of the present invention.

TABLE 1

|  | k (room temp.) | k (200° C.) | Δk | k recovery ratio (%) | Leakage current (A/cm$^2$) | Leakage current recovery ratio(%) |
| --- | --- | --- | --- | --- | --- | --- |
| Initial | 2.45 | 2.29 | 0.16 | — | $4.38 \times 10^{-9}$ | — |
| Etching + Ashing | 3.73 | 3.53 | 0.20 | — | $3.33 \times 10^{-5}$ | — |
| silylation process (conventional) | 3.13 | 2.87 | 0.25 | 47 | $5.31 \times 10^{-8}$ | 72 |
| silylation process (present) | 3.20 | 2.92 | 0.28 | 41 | $8.94 \times 10^{-8}$ | 66 |

Further, a total processing time of the conventional silylation process amounted to about 220 seconds wherein about 40 seconds was taken to increase a pressure up to 6665 Pa (50 Torr), 30 seconds to reduce the pressure from 6665 Pa (50 Torr) to an unloading pressure and 150 seconds to maintain the pressure level of 6665 Pa (50 Torr). In comparison, a total processing time of the silylation process in accordance with the present embodiment just amounted to about 15 seconds wherein about 5 seconds was taken to increase the a pressure up to 1333 Pa (10 Torr) and about 10 seconds to reduce the pressure from 1333 Pa (10 Torr). As a result, a remarkably high effect of improving a throughput could be obtained by the silylation process in accordance with the present embodiment.

Moreover, it is to be noted that the present invention may be modified in various ways without being limited to the aforementioned embodiment. For example, as a Si-containing low-k film to be etched, it is possible to use a SiOC-based film (which is obtained by adding a methyl group (—CH$_3$) to an Si—O bond of a conventional SiO$_2$ film, thus allowing a Si—CH$_3$ bond to coexist; Black Diamond (Applied Materials Corp.), Coral (Novellus Systems Inc.), Aurora (ASM International N.V.) and so forth are examples, and both porous one and dense one are available), instead of the MSQ (either porous or dense) formed by the SOD device.

Moreover, though the above embodiment has been described for the case of applying the present invention to the manufacturing process of the semiconductor device containing Cu wiring formed by the single damascene method, the present invention can be applied to various processes for removing an etching mask on an etching target film in the course of manufacturing various semiconductor devices.

While the invention has been shown and described with respect to the embodiment, it will be understood by those skilled in the art that various changes and modifications may be made without departing from the scope of the invention as defined in the following claims.

What is claimed is:

1. A processing method comprising:
   supplying a gas having a Si—CH$_3$ bond into a processing chamber after a target substrate to be processed is loaded into the processing chamber; and
   performing a silylation process on the target substrate,
   wherein the internal pressure of the chamber by the supply of the gas having the Si—CH$_3$ bond and the gas supply time are set to be within ranges where the silylation process can be performed, while the internal pressure of the chamber is decreased to reach an eligible pressure level where the wafer can be unloaded after the internal pressure of the chamber is increased up to a preset pressure by the supply of the gas,
   wherein after the internal pressure of the chamber reaches the preset pressure by the supply of the gas having the Si—CH$_3$ bond, the internal pressure of the chamber is decreased gradually without being maintained at the target pressure.

2. The processing method of claim 1, wherein the gas having the Si—CH$_3$ bond is made up of at least one of TMS-DMA (Dimethylaminotrimethylsilane), TMMAS (Trimethylmethylaminosilane), TMICS (Trimethyl(isocyanato)silane), TMSA (Trimethylsilylacetylene), and TMSC (Trimethylsilylcyanide).

3. The processing method of claim 1, wherein the preset pressure is about 1333 Pa (10 Torr).

4. The processing method of claim 1, wherein the silylation process is performed while the temperature of the target substrate is kept at about 100° C. or greater.

5. A computer readable storage medium for storing therein a computer executable control program for controlling a processing apparatus, wherein, the control program, when executed, controls the processing apparatus to perform the processing method described in claim 1.

* * * * *